United States Patent
Scanlan

(10) Patent No.: US 8,922,021 B2
(45) Date of Patent: Dec. 30, 2014

(54) DIE UP FULLY MOLDED FAN-OUT WAFER LEVEL PACKAGING

(71) Applicant: DECA Technologies, Inc., Tempe, AZ (US)

(72) Inventor: Christopher M. Scanlan, Chandler, AZ (US)

(73) Assignee: DECA Technologies Inc., Tempe, AZ (US)

( * ) Notice: Subject to any disclaimer, the term of this patent is extended or adjusted under 35 U.S.C. 154(b) by 0 days.

(21) Appl. No.: 14/024,928

(22) Filed: Sep. 12, 2013

(65) Prior Publication Data

US 2014/0008809 A1    Jan. 9, 2014

Related U.S. Application Data

(63) Continuation of application No. 13/632,062, filed on Sep. 30, 2012, now Pat. No. 8,535,978, which is a continuation-in-part of application No. 13/341,654, filed on Dec. 30, 2011, now Pat. No. 8,604,600.

(60) Provisional application No. 61/672,860, filed on Jul. 18, 2012.

(51) Int. Cl.
*H01L 23/08*        (2006.01)
*H01L 21/00*        (2006.01)
(Continued)

(52) U.S. Cl.
CPC ......... *H01L 21/56* (2013.01); *H01L 2224/2101* (2013.01); *H01L 23/28* (2013.01); *H01L 2224/96* (2013.01); *H01L 21/78* (2013.01); *H01L 2224/131* (2013.01); *H01L 21/568* (2013.01); *H01L 24/94* (2013.01); *H01L 2224/214* (2013.01); *H01L 24/96* (2013.01); *H01L 21/561* (2013.01); *H01L 2224/12105* (2013.01); *H01L 24/13* (2013.01); *H01L 24/92* (2013.01); *H01L 24/20* (2013.01); *H01L 23/3128* (2013.01); *H01L 23/48* (2013.01);
(Continued)

(58) Field of Classification Search
CPC .................. H01L 21/6835; H01L 2224/73265; H01L 2224/97; H01L 2924/14; H01L 2924/01079; H01L 21/78; H01L 21/56; H01L 21/561; H01L 21/568; H01L 23/48; H01L 23/28; H01L 24/20; H01L 24/92; H01L 24/94; H01L 24/96; H01L 24/19
USPC .......... 257/666, 678, 685, 773, 737; 438/107, 438/110, 124, 113, 127
See application file for complete search history.

(56) References Cited

U.S. PATENT DOCUMENTS 4,740,414 A * 4/1988 Shaheen ........................ 428/210
5,548,091 A    8/1996 DiStefano et al.
(Continued)

FOREIGN PATENT DOCUMENTS

JP        3255970 A       11/1991
WO    2010/080068 A1     7/2010

OTHER PUBLICATIONS

Kwak, Hocheol and Hubing. Todd, An Overview of Advanced Electronic Packaging Technology, May 1, 2007.
(Continued)

*Primary Examiner* — Nikolay Yushin
(74) *Attorney, Agent, or Firm* — Booth Udall Fuller, PLC

(57) ABSTRACT

A method of manufacturing a semiconductor chip comprising placing a plurality of die units each having an active front surface and a back surface facing front surface up on an encapsulant layer, encapsulating the plurality of die units on the active surface of the encapsulant layer with an encapsulant covering a front surface and four side surfaces of each of the plurality of die units, and exposing, through the encapsulation on the front surface, conductive interconnects electrically connecting a die bond pad to a redistribution layer.

28 Claims, 10 Drawing Sheets

(51) Int. Cl.
*H01L 23/28* (2006.01)
*H01L 21/78* (2006.01)
*H01L 21/56* (2006.01)
*H01L 23/00* (2006.01)
*H01L 23/48* (2006.01)
*H01L 23/31* (2006.01)

(52) U.S. Cl.
CPC .............. *H01L 24/11* (2013.01); *H01L 2224/94* (2013.01); *H01L 23/562* (2013.01); *H01L 2224/215* (2013.01); *H01L 24/19* (2013.01); *H01L 2224/92* (2013.01); *H01L 23/3114* (2013.01)
USPC ........................... 257/773; 257/737; 438/127

(56) References Cited

U.S. PATENT DOCUMENTS

| | | |
|---|---|---|
| 7,456,496 B2 | 11/2008 | Hwee et al. |
| 7,476,980 B2 | 1/2009 | Rebibis et al. |
| 7,482,203 B2 | 1/2009 | Song et al. |
| 7,550,857 B1 | 6/2009 | Longo et al. |
| 7,777,351 B1 | 8/2010 | Berry et al. |
| 7,829,380 B2 | 11/2010 | Irsigler et al. |
| 8,030,770 B1 | 10/2011 | Juskey et al. |
| 8,288,209 B1 | 10/2012 | Chi et al. |
| 8,436,255 B2 | 5/2013 | Goh |
| 8,487,435 B2 | 7/2013 | Juskey et al. |
| 8,653,674 B1 | 2/2014 | Darveaux et al. |
| 2003/0027373 A1 | 2/2003 | Distefano et al. |
| 2003/0092217 A1 | 5/2003 | Coyle |
| 2003/0164554 A1 | 9/2003 | Fee et al. |
| 2005/0208700 A1 | 9/2005 | Kwon et al. |
| 2006/0275949 A1 | 12/2006 | Farnworth et al. |
| 2006/0291029 A1 | 12/2006 | Lin et al. |
| 2008/0237828 A1 | 10/2008 | Yang |
| 2009/0302484 A1* | 12/2009 | Lee et al. ............. 257/777 |
| 2010/0052135 A1 | 3/2010 | Shim et al. |
| 2010/0167471 A1 | 7/2010 | Jin et al. |
| 2010/0195299 A1 | 8/2010 | Souriau et al. |
| 2010/0308474 A1 | 12/2010 | Shibuya et al. |
| 2011/0001215 A1* | 1/2011 | Lam ........................ 257/531 |
| 2011/0042796 A1 | 2/2011 | Chang et al. |
| 2011/0095413 A1 | 4/2011 | Barth et al. |
| 2011/0156250 A1 | 6/2011 | Goh et al. |
| 2011/0186977 A1 | 8/2011 | Chi et al. |
| 2011/0193205 A1 | 8/2011 | Hsieh |
| 2011/0202896 A1 | 8/2011 | Scanlan et al. |
| 2011/0250396 A1 | 10/2011 | Matsutani et al. |
| 2012/0032314 A1 | 2/2012 | Chen et al. |
| 2012/0119373 A1 | 5/2012 | Hunt |
| 2012/0133001 A1 | 5/2012 | Tkaczyk et al. |
| 2013/0026658 A1 | 1/2013 | Chen |
| 2013/0062760 A1 | 3/2013 | Hung et al. |
| 2013/0168848 A1 | 7/2013 | Lin et al. |
| 2013/0270682 A1 | 10/2013 | Hu et al. |
| 2013/0307140 A1 | 11/2013 | Huang et al. |
| 2013/0334698 A1 | 12/2013 | Mohammed et al. |
| 2014/0042600 A1 | 2/2014 | Kim et al. |
| 2014/0054802 A1 | 2/2014 | Shim et al. |
| 2014/0057394 A1 | 2/2014 | Ramasamy et al. |

OTHER PUBLICATIONS

Kripesh, Vaidyanathan et al., Design and Development of a Multi-Die Embedded Micro Wafer Level Package, Institute of Microelectronics, Singapore, 2008.

Micronews, Fan-in WLCSP matures, what's next?, 3 D Packaging Magazine, Issue 14, Feb. 2008, pp. 2-5.

Th, E.K. et al, Encapsulation Challenges for Wafer Level Packaging, Electronics Packaging Technology Conference, 2009.

* cited by examiner

DIE UP FULLY MOLDED FAN-OUT WAFER LEVEL PACKAGING

CROSS REFERENCE TO RELATED APPLICATIONS

This document is a continuation of U.S. application Ser. No. 13/632,062, entitled "Die Up Fully Molded Fan-Out Wafer Level Packaging," which was filed on Sep. 30, 2012, which application is a continuation in part of U.S. application Ser. No. 13/341,654, entitled "Fully Molded Fan-Out," which was filed on Dec. 30, 2011, and claims the benefit of the filing date of U.S. Provisional Patent No. 61/672,860, entitled "Fan-Out Semiconductor Package," which was filed on Jul. 18, 2012, the disclosures of which are hereby incorporated by reference in their entireties.

TECHNICAL FIELD

This disclosure relates to the field of panelized packaging of semiconductor devices.

BACKGROUND

A common method of panelized packaging gaining acceptance in industry is fan-out wafer level packaging (WLP) in which multiple die units are placed face down on a temporary tape carrier. The multiple die units and temporary tape carrier are overmolded with a molding compound using a compression molding process. After molding the tape carrier is removed, leaving the active surface of the multiple die units exposed in a structure commonly referred to as a reconstituted wafer. Subsequently, a wafer level chip scale package (WLCSP) build-up structure is formed on top of the reconstituted wafer. Ball grid array (BGA) balls are attached to the reconstituted wafer and then the reconstituted wafer is saw singulated to form individual packages.

SUMMARY

Embodiments of a method of manufacturing a semiconductor chip may comprise placing a plurality of die units face up on an encapsulant layer, each die unit having an active front surface and a back surface opposing the active front surface, the active front surface and the back surface joined by at least four side surfaces, encapsulating the plurality of die units on the active front surface of the encapsulant layer with an encapsulant covering a active front surface and four side surfaces of each of the plurality of die units, and exposing, through the encapsulant covering on the active front surface, at least one conductive interconnect electrically coupled to a die bond pad.

Particular embodiments may comprise one or more of the following features. The encapsulant layer may be a polymer layer. The polymer layer may be a dielectric film. The dielectric film may be an epoxy film positioned between the die units and a carrier. Applying the epoxy film may comprise applying the epoxy film having substantially the same thickness as a thickness of the encapsulant covering the active surface after the conductive interconnect is exposed. The conductive interconnect may be a plated copper post. The copper posts may be plated over die bond pads on the active surface of the die units. Encapsulating the plurality of die units may further comprise encapsulating through a compression molding process. Encapsulating the plurality of die units may further comprise encapsulating through a lamination process. Applying a fan-in redistribution layer to a native device wafer before encapsulating the plurality of die units. The conductive interconnect may be a plurality of copper posts plated over redistribution layer traces. Curing the encapsulant layer. The conductive interconnect may further electrically couple to a fan-out redistribution layer. Applying a dielectric film to a back surface of at least one of the die units. The conductive interconnect may have a height of at least about 20 microns. Exposing the at least one conductive interconnect may comprise adjusting a thickness of the encapsulant covering the active front surface of the die units by removing encapsulant until the thickness of the encapsulant covering the active front surface is between a ratio of 5:1 and 1:5 compared with a thickness of encapsulant on a back surface of the die units.

According to another aspect of the disclosure, a wafer level package may comprise a die unit having an active surface and a back surface opposing the active surface, the active surface and back surface joined by four side surfaces, the back surface in contact with an encapsulant layer, an encapsulant that encapsulates the die unit and covers the active surface and four side surfaces of the die unit, and a plurality of conductive interconnects electrically connecting a plurality of die bond pads on the active surface to a first redistribution layer.

Particular embodiments may comprise one or more of the following features. The first redistribution layer is a fan-out redistribution layer. The encapsulant layer may be a polymer layer. The polymer layer may be a dielectric film. The dielectric film may be an epoxy film positioned between the die units and a carrier. The conductive interconnects may be plated over traces of the redistribution layer. The conductive interconnects may be plated over die bond pads on the active surface of the plurality of die units. The encapsulant layer may be a compliant epoxy film applied after encapsulation. A thickness of the encapsulant covering the active surface may be substantially the same thickness as a thickness of the encapsulant layer covering the back surface. A thickness of the encapsulant covering the active surface may have a ratio of between approximately 1/5 and 5 in relation to a thickness of the encapsulant layer covering the back surface. The plurality of conductive interconnects may have a height of at least about 20 microns.

The foregoing and other aspects, features, and advantages will be apparent to those artisans of ordinary skill in the art from the DETAILED DESCRIPTION and DRAWINGS, and from the CLAIMS.

BRIEF DESCRIPTION OF THE DRAWINGS

The present disclosure is illustrated by way of example, and not by way of limitation, in the FIGs. of the accompanying drawings.

DETAILED DESCRIPTION

Figure 1:
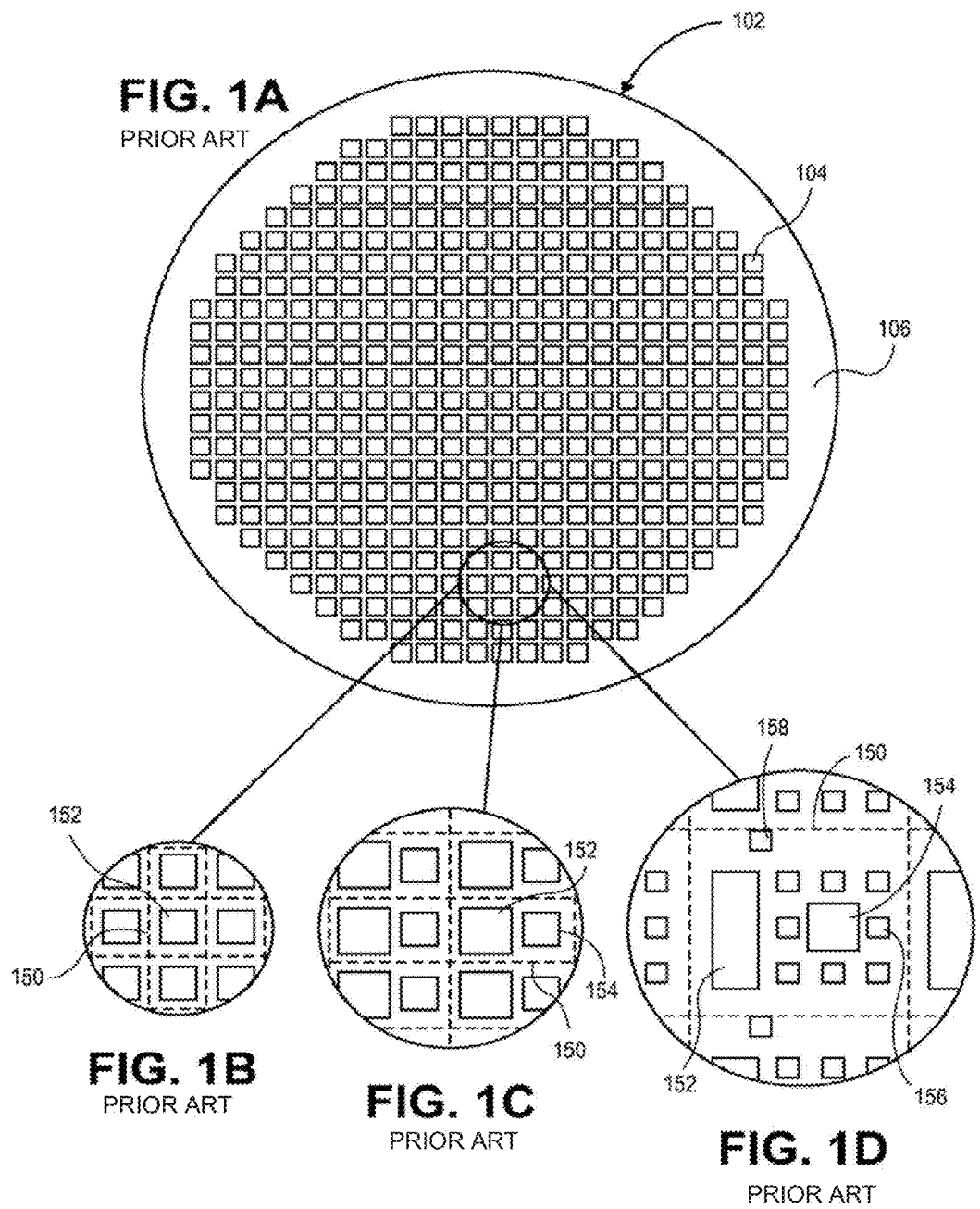
FIG. 1A illustrates a conventional embodiment of a reconstituted wafer.
FIGS. 1B-1D illustrate top views of a plurality of conventional packages or modules arranged in a reconstituted wafer.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular embodiments may vary from these exemplary details and still be contemplated to be within the spirit and scope of the present invention.

The terms "over", "between" and "on" as used herein refer to a relative position of one layer with respect to other layers. One layer deposited or disposed over or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

The embodiments disclosed herein include methods and structures applicable to panelized packaging, such as fan-out and fan-in WLCSP. In the following description, specific embodiments are described with regard to single die applications. Embodiments of the present invention may also be useful in multi-die modules or some combination of die and passive components (such as capacitors, inductors, or resistors) and/or other components (such as an optical elements, connectors, or other electronic components) within modules.

One of ordinary skill in that art would be aware that the embodiments disclosed herein may utilize a fan-in RDL to move connection points in an X-Y plane so that the connection points are spaced closer to each other in the X-Y plane. In contrast, a fan-out RDL may be used to move connection points farther apart in the X-Y plane. Both types of RDL may establish the new connection points in a Z direction away from the original connection points, which may include bond pads of the die unit.

One of ordinary skill in the art would also be aware that a plurality of device units may be assembled and molded to create a panel, or reticulated wafer ("wafer"). Device units may be active device units such as dies, and may also be passive device units such as an integrated passive network, or a discrete passive device unit such as a capacitor, resistor, or inductor. The surface of the die that includes one or more interconnects to the active components within the dies is called the active surface (see FIG. 3 for example). The device units may be pre-packaged, though pre-packaging is not required. In accordance with embodiments of the present disclosure, the pre-packages may contain single or a plurality of device units and other components.

Embodiments described herein may be used in any panelized packaging application including single-die applications, multi-die modules, some combination of a die(s) and a passive component(s) within a module, or some combination of a device unit(s) and another component(s) within a module.

FIG. 1A illustrates an example of a conventional wafer 102 including a plurality of device units 104 overmolded with an encapsulating material 106 such as, for example, an epoxy resin or other polymer. As illustrated in the conventional approach taken FIG. 1A, the active surfaces of the plurality of device units 104 are substantially flush with the encapsulating material 106 and are not encapsulated. Conventional wafer 102 is sometimes formed as a reconstituted wafer formed in a WLP technique where the plurality of device units are placed active surface face down on a temporary adhesive carrier, such as a temporary tape carrier, followed by overmolding with an encapsulant, such as epoxy molding compound, using a compression molding process, followed by removal of the temporary adhesive carrier leaving the active surfaces of the plurality of die units exposed.

Subsequently, a build-up structure may be formed on top of the conventional structure illustrated in FIG. 1A and the device units are singulated to form packages or modules. For example, as illustrated in FIG. 1B, the wafer is conventionally singulated into a plurality of single-die packages 150, each package including a single semiconductor die unit 152. Referring to FIG. 1C, a plurality of die units 152, 154 are conventionally mounted within the molded wafer and singulated to form multi-die packages 150, also called multi-die modules. Referring to FIG. 1D, a single die unit 152 or a plurality of die units 152, 154 are then conventionally mounted within the molded wafer with the addition of a passive device(s) 156 (such as capacitor, inductor or resistor) and/or other component(s) 158 (such as an optical element, connector or other electronic component) and singulated to form a packages 150 which include both an active device(s) and a passive device(s) and/or other components 158. Expanding upon conventional practice, a variety of combinations of active and passive devices and optionally other components within packages or modules are envisioned in accordance with embodiments of the present disclosure. Accordingly, the particular configurations illustrated in FIGS. 1B-1D are meant to be illustrative rather than limiting. As illustrated in the top-down view of FIGS. 1A-1D, each of the die units 152 includes at least four sides represented in the illustrations by the sides of the rectangular die units.

Embodiments of this process may result in packages having encapsulant, also called mold compound, in contact with the back of the dies, but no material covering the front of the dies. As a result, extensive post processing may be used to mitigate wafer warpage. This may include constraining the wafer during post mold cure, or grinding to remove encapsulant from the back of the dies after molding. According to one, an encapsulant layer, such as a laminated epoxy film, may be applied over the back of the wafer after first removing the encapsulant from the back of the wafer.

A package constructed in this manner may also have a topographical discontinuity where the edge of the die meets the encapsulant, which may be caused by the die being compressed into the adhesive during molding as well as mold flash. Thus, a process for constructing a redistribution layer (RDL) structure may need to be designed to accommodate this topographical discontinuity.

In one embodiment, a die packaging process may address these issues by encapsulating the front (active) and four sides of the die simultaneously during the molding of the wafer. An encapsulant, such as an epoxy film, is applied to the back of the die (opposite the active surface) in a separate step either before or preferably after the encapsulation process. Ideally, a similar thickness of encapsulant is used on the front side of the die as the thickness of the encapsulant, such as an epoxy film, applied to the back side of the die. This provides a balanced structure with reduced warpage, such that subsequent grinding of the back of the wafer is not needed. In one embodiment, a fan-in or other RDL structure may be constructed on the native wafer, allowing for more flexible routing.

In an embodiment, a semiconductor device package manufacturing process may substantially encapsulate the die unit within the encapsulant and may further connect bond pads at an active surface of the die unit to conductive material at the exterior of the semiconductor device package. For example, the conductive interconnects, such as conductive posts, may be constructed from a conductive material such as copper that is plated onto the bond pads to or onto a fan-in RDL structure that is connected to the bond pads thereby creating one or more conductive interconnects. In one embodiment, the conductive interconnects may be electrically connected to conductive material that is part of a fan-out RDL structure or solder balls.

Figure 2:
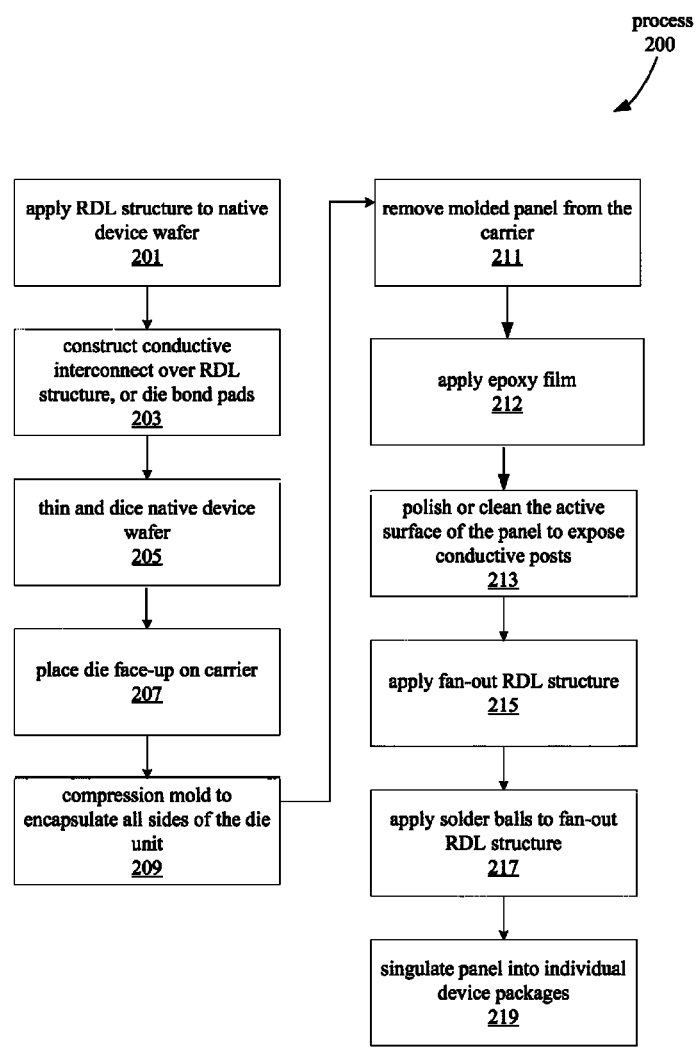
FIG. 2 is a flow diagram illustrating an embodiment of process for manufacturing a semiconductor package.

FIG. 2 illustrates a specific process embodiment for encapsulating a semiconductor die package in an encapsulant to create a semiconductor chip package. In one embodiment, the packaging process 200 may be performed on a native device wafer, on which a plurality of semiconductor die units have been constructed.

Packaging process 200 begins at block 201. At block 201, an RDL structure may be applied to the native device wafer. For example, a fan-in or fan-out RDL structure may be applied to the individual die units of the native device wafer. The following portions reference the non-limiting example structures illustrated in FIGS. 3-11 in relation to the example process illustrated in FIG. 2 and reference will be made to the process steps in relation to each FIG.

Figure 3:
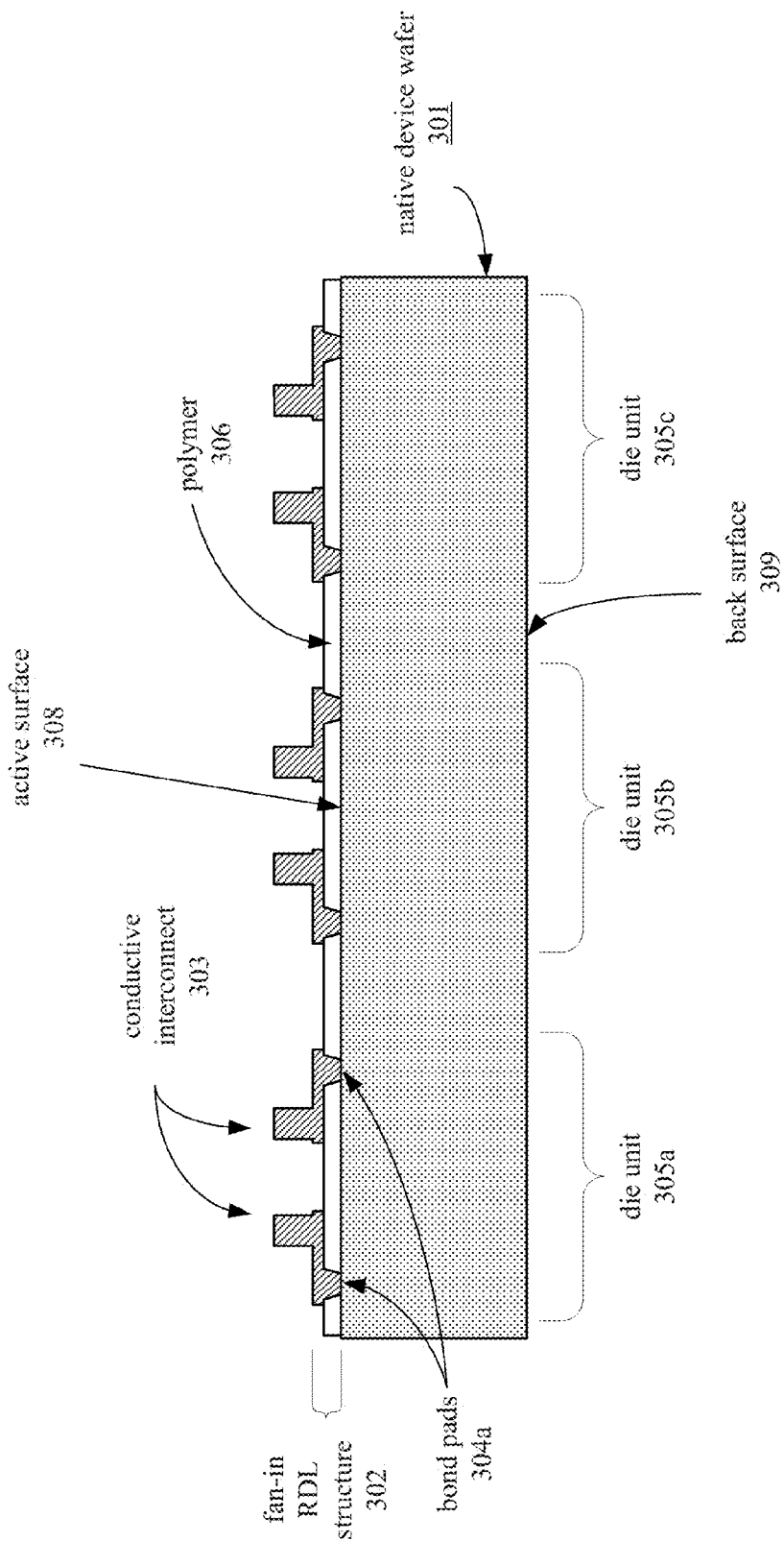
FIGS. 3-4 illustrate an embodiment of a device wafer having an RDL structure and conductive posts.

FIG. 3 illustrates an embodiment of a native device wafer 301, including multiple die units 305a, 305b, and 305c that may be used, for example, in packaging process 200. A fan-in RDL structure 302 may be used to electrically couple the bond pads 304a of the die unit 305a to one or more conductive interconnects, in this embodiment formed as conductive posts 303, such as conductive posts, to be plated onto the fan-in RDL structure 302. Alternatively, any other appropriate RDL structure or a pillar bump directly over the die bond pad may also be used here. In one embodiment, the fan-in or other RDL structure may include multiple layers; alternatively, the structure may include a single layer. In one embodiment, the fan-in or other RDL structure may include one or more polymer layers 306; alternatively, the one or more polymer layers 306 may be omitted from certain embodiments. The one or more polymer layers 306, as well as the encapsulant 601 (FIG. 6), the encapsulant layer (such as laminated epoxy layer 910 in FIG. 8), and any encapsulant layer used in this disclosure (collectively encapsulant layer) may be formed of any encapsulant known to those of ordinary skill in the art for use in semiconductor manufacturing for encapsulating semiconductor dies during a molding process. Typically, encapsulant layers are formed of a polymer, often as a dielectric layer that may be formed as a dielectric film and in some cases as a compliant epoxy film. Any reference herein to particular embodiments of encapsulant layers provided throughout the examples in this disclosure are not intended as limiting the particular to a particular encapsulant type and all such references should be understood as encompassing the full scope of the meaning of an encapsulant layer unless specifically noted.

Returning to FIG. 2, the process continues at block 203 where one or more conductive interconnects, in this embodiment formed as conductive posts 303 is added over any RDL structure 302 constructed according to block 201 or coupled directly to die bond pads 304a on the active surface 308 of the die units 305a, 305b, 305c. Alternatively, if such an RDL structure 302 is omitted, the conductive posts 303 may be constructed directly on the bond pads, such as bond pads 304a, of the semiconductor die units. In either case, the conductive posts 303 may be electrically connected to the bond pads of the die units 305, either directly, or through the RDL structure 302. In one embodiment, the conductive posts 303 are spacer elements that are designed to electrically couple the bond pads 304a of the die unit 305a to conductive material at an exterior surface of the semiconductor device package (not shown), when completed. In one embodiment, the conductive posts 303 may be constructed by plating copper posts over the previously added RDL structure 302 in the form of RDL traces to a height of about at least 20 microns tall. Alternatively, nickel, tin, and tin-alloys, and other metals and metal alloys may be used for plating. Alternatively, other conductive materials and formation methods are known in the art to form conductive interconnects.

Figure 4:
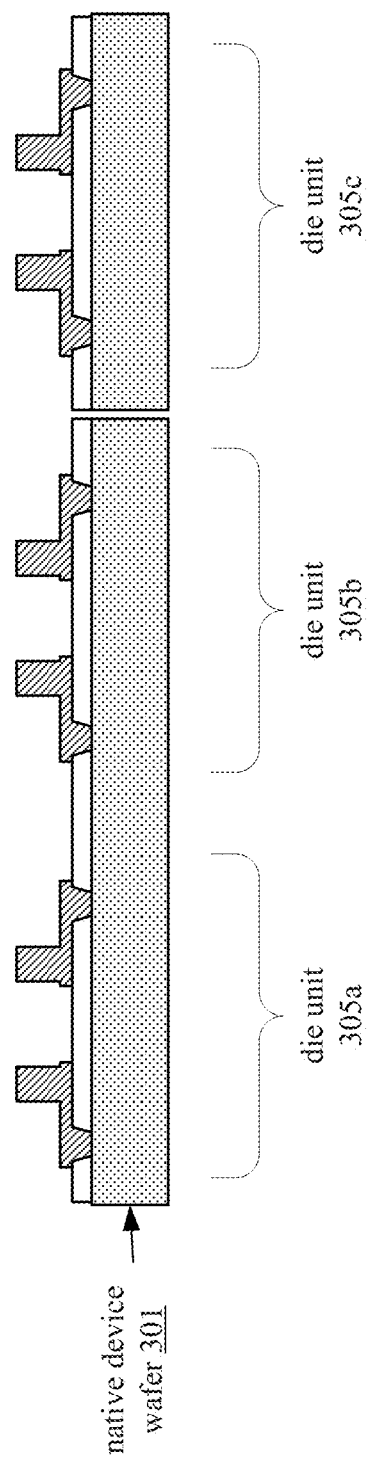
Figure 6:
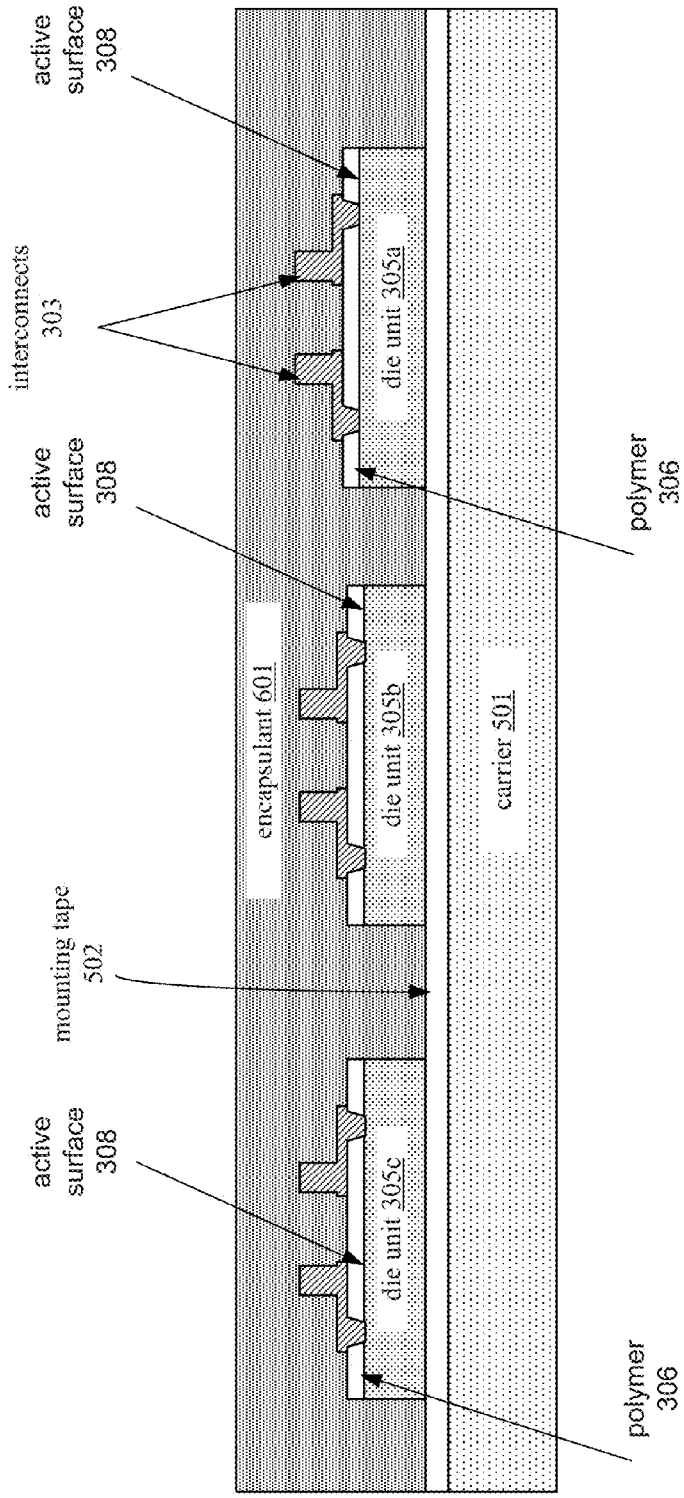
FIG. 6 illustrates die units encapsulated in mold compound, according to an embodiment.

Returning to FIG. 2, at block 205, the native device wafer 301 may be thinned and diced into individual die units (see e.g., FIG. 4, die unit 305c) prior to encapsulating in an encapsulant, such as a mold compound (see e.g. FIG. 6, encapsulant 601). If the native device wafer is already the desired thickness, thinning may not be needed prior to dicing the wafer into individual die units. Thus, each of the die units is separated from each of the other device units making up the wafer. FIG. 4 illustrates the native device wafer 301, according to an embodiment, at its final thickness, and die unit 305c, which has been separated from the other die units 305a and 305b. From block 205, the packaging process 200 continues at block 207.

Figure 5:
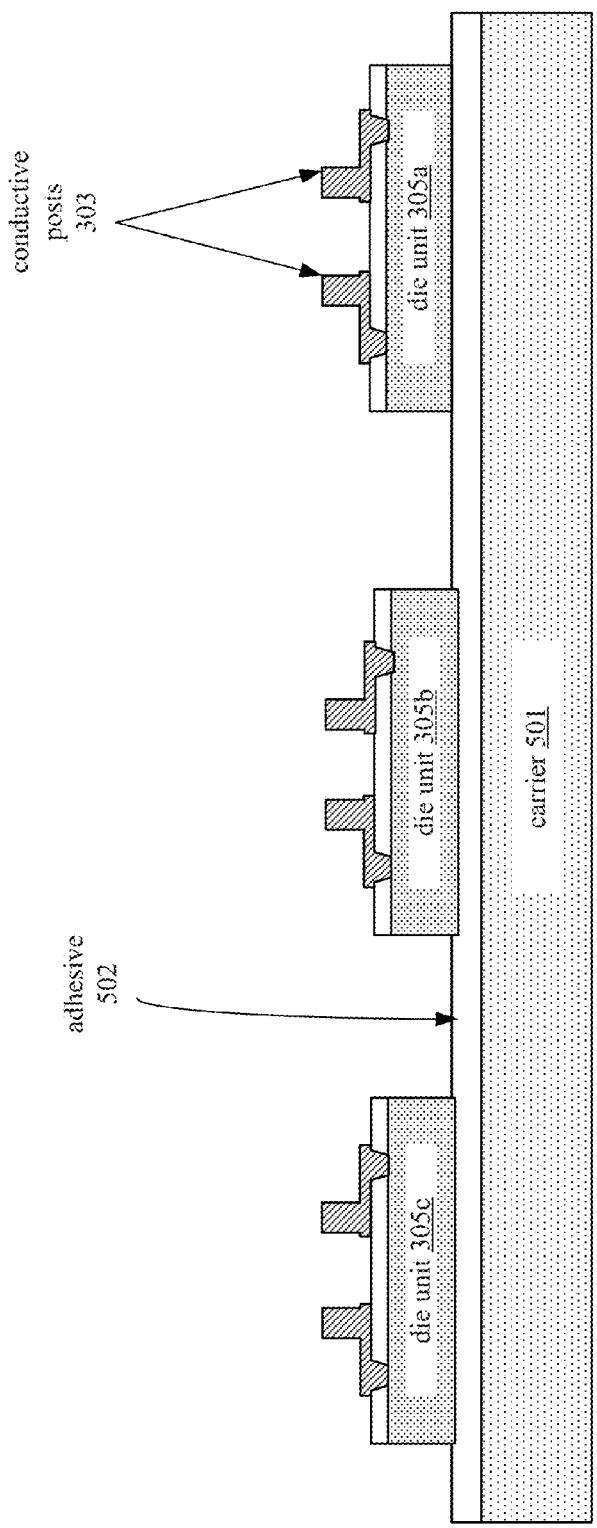
FIG. 5 illustrates die units mounted on a carrier element, according to an embodiment.

FIG. 5 illustrates die units 305c, 305b, and 305a as placed on a carrier 501, according to an embodiment. At block 207, the semiconductor die units 305c, 305b, and 305a may be placed with the active side upward (with bond pads facing upward) on a carrier 501 using an adhesive 502, such as, by non-limiting example, a sacrificial double-sided mounting tape or an epoxy film or other encapsulant layer. In one embodiment, at least one conductive post 303 is electrically connected with at least one bond pad of the die unit 305a.

FIG. 6 illustrates a carrier 501 on which die units 305c, 305b, and 350a are mounted on an adhesive 502, where the die units 305a-c are encapsulated by an encapsulant 601 during a molding process, according to a particular embodiment. Referencing the process diagram of FIG. 2, at block 209 of packaging process 200, a molding process may be performed to encapsulate the die units within an encapsulant 601. In one embodiment, the molding process is a compression molding process, however, other methods of encapsulation such as, for example, lamination may also be used. In one particular embodiment, the die unit 305a is substantially encapsulated by the mold compound such that encapsulant is present directly on at least the active surface 308 and the four sides of the die unit extending between the active surface and the back surface, opposite the active surface 308, of the die unit.

In one embodiment, the encapsulant 601 may be applied by the compression molding process and may distribute the encapsulant such that a thickness of the encapsulant over the back surface of the semiconductor die unit 305a, or an epoxy layer applied to the back of the semiconductor die unit 305a, is within a thickness ratio of between approximately 1:5 to 5:1 when compared with the thickness of the mold compound present over the active side, of the die unit 305a.

Returning to FIG. 2, at block 211, the molded wafer panel is removed from the carrier. At block 212, an encapsulant layer, such as an epoxy film, is added to the unencapsulated back side of the die units. This step may be performed before or after encapsulation. Ideally, as described more fully below, the encapsulant layer is approximately the same thickness as the final encapsulant layer on the active side of the surface. It has been found that approximately the same thickness may range between a ratio of between 5:1 to 1:1 to 1:5 die active surface encapsulant layer compared with die back surface encapsulant layer works best, though other ratios are contemplated. At block 213 of FIG. 2, material may be removed from the active surface of the molded wafer to expose the conductive interconnects, sometimes called conductive posts. For example, the molded wafer panel may be cleaned, polished, or ground down to expose the conductive interconnects at the surface of the molded wafer panel. This cleaning, polishing, or grinding may also be used to create a desired remaining thickness of encapsulant over the die units so that an appropriate ratio of thickness of encapsulant over the active surface of the die units is maintained relative to the thickness of encapsulant, such as epoxy, polymer, or dielectric film on the back of the die units to reduce the likelihood of wafer warpage. Using encapsulant on both the active and back sides of the die, if the encapsulant has significantly different thicknesses, has a tendency to cause the wafers to warp causing damage to the die units. While any ratio of thickness of encapsulant over the active surface of the die units to thickness of encapsulant on the back of the dies units may be used, in one embodiment it may be preferable to maintain a ratio of between approximately 1:5 to 5:1.

Figure 7:
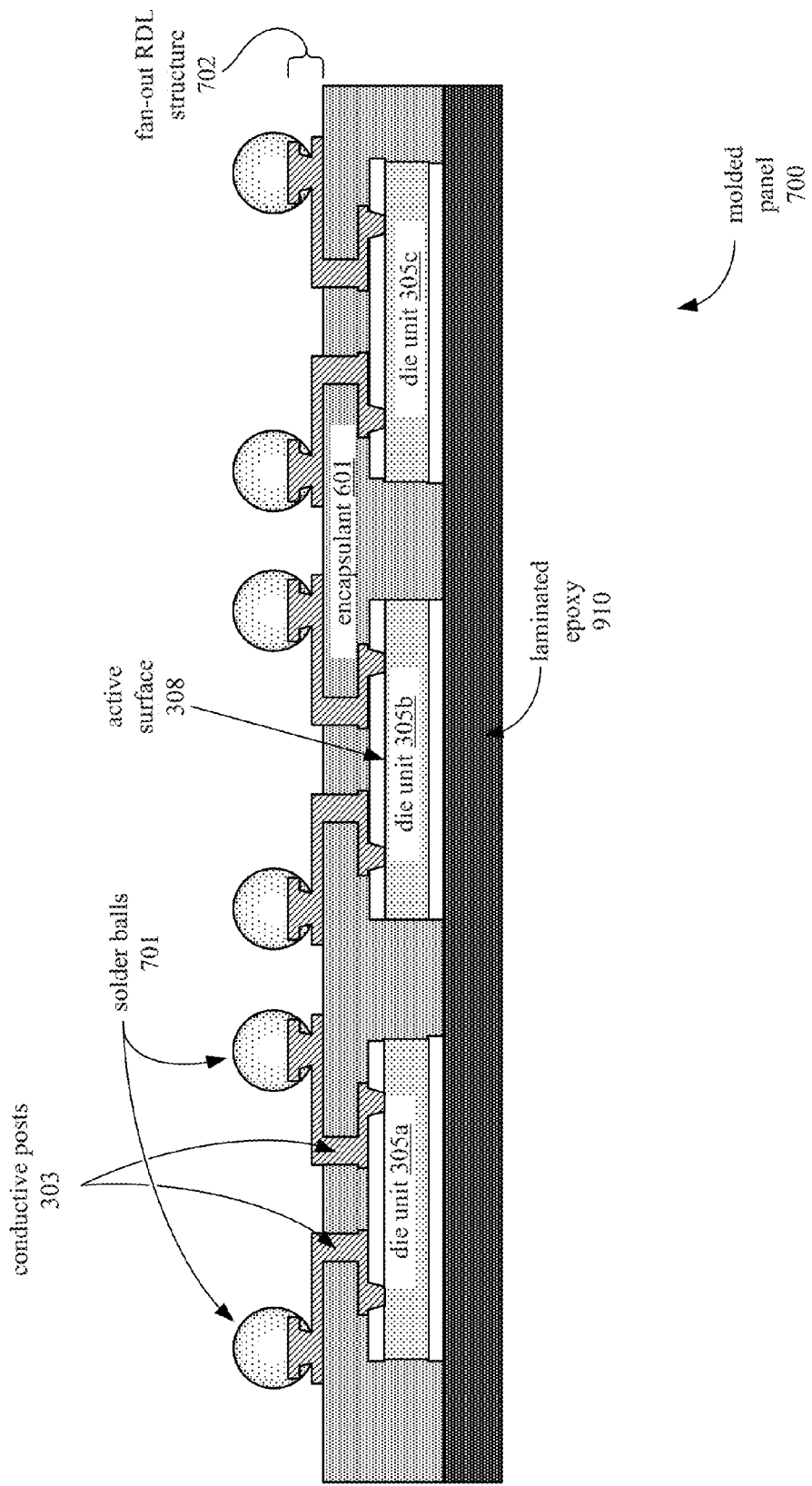
FIG. 7 illustrates die units encapsulated in mold compound and with solder balls applied, according to an embodiment.

FIG. 7 illustrates a molded wafer panel 700 (molded panel) including die units 305a, 305b, and 305c with a fan-out RDL structure 702 and solder balls 701, according to a particular embodiment. Returning to FIG. 2, at block 215, an optional fan-out redistribution layer ("RDL") structure 702 may be constructed on the active surface of the molded wafer panel 700, and may be electrically connected to the conductive interconnects formed as conductive posts 303. In one particular embodiment, the fan-out RDL structure 702 may include multiple layers; alternatively, the structure may include a single layer. In one embodiment, the fan-out RDL structure 702 may include one or more layers of polymer; alternatively, the layers of polymer may be omitted from certain embodiments.

Referring to FIG. 2, at block 217 solder balls 701 may be applied to the fan-out RDL structure 702. In an alternative embodiment where a fan-out RDL structure 702 may be omitted, the solder balls 701 may be applied directly to the conductive interconnects, in this embodiment formed as conductive posts 303. Such application of solder balls 701 may be used when the device package being manufactured is a ball grid array (BGA) package.

Figure 8:
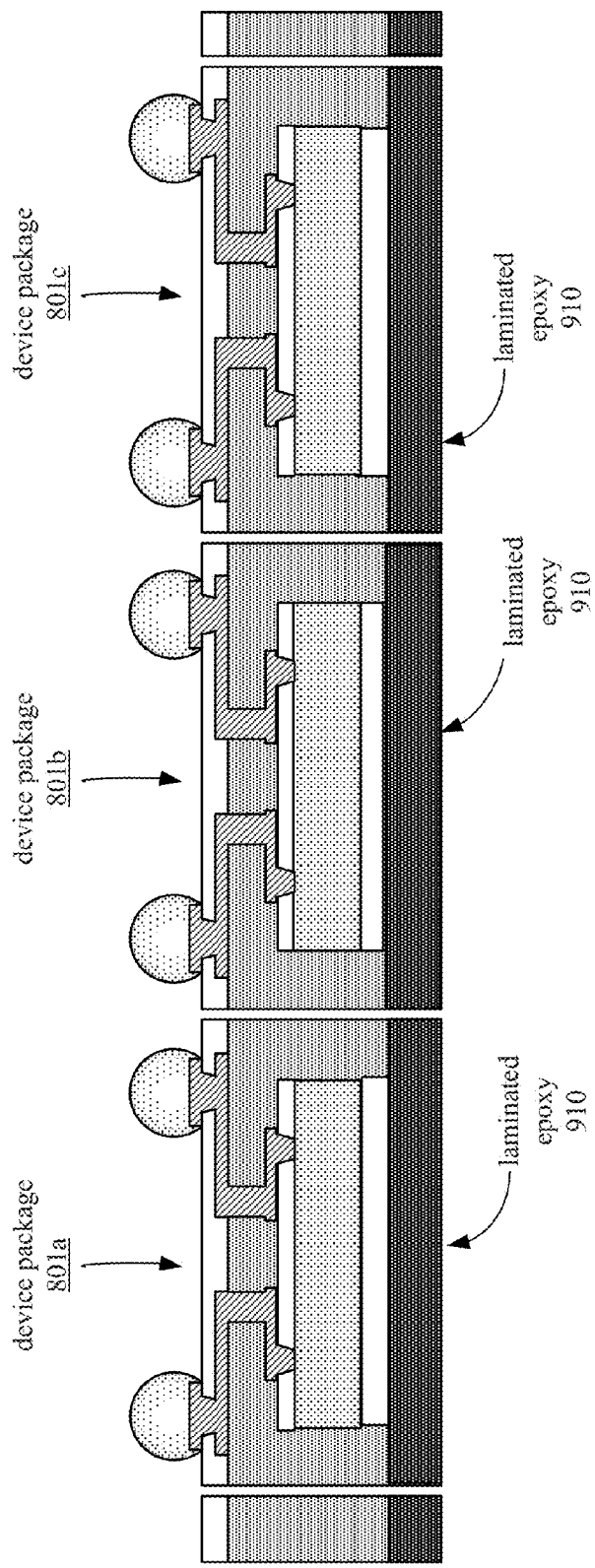
FIG. 8 illustrates singulated device packages, according to an embodiment.

At block 219 of FIG. 2, the molded wafer panel may be singulated into individual device packages. FIG. 8 illustrates one embodiment of a molded wafer panel (like molded wafer panel 700 illustrated in FIG. 7) that has been singulated into multiple device packages 801a, 801b, and 801c, according to a particular embodiment. In one particular embodiment, a saw may be used to cut the wafer panel, separating each of the encapsulated die units from each of the other encapsulated die units in the wafer panel to form the individual device packages 801a, 801b, 801c.

Figure 9:
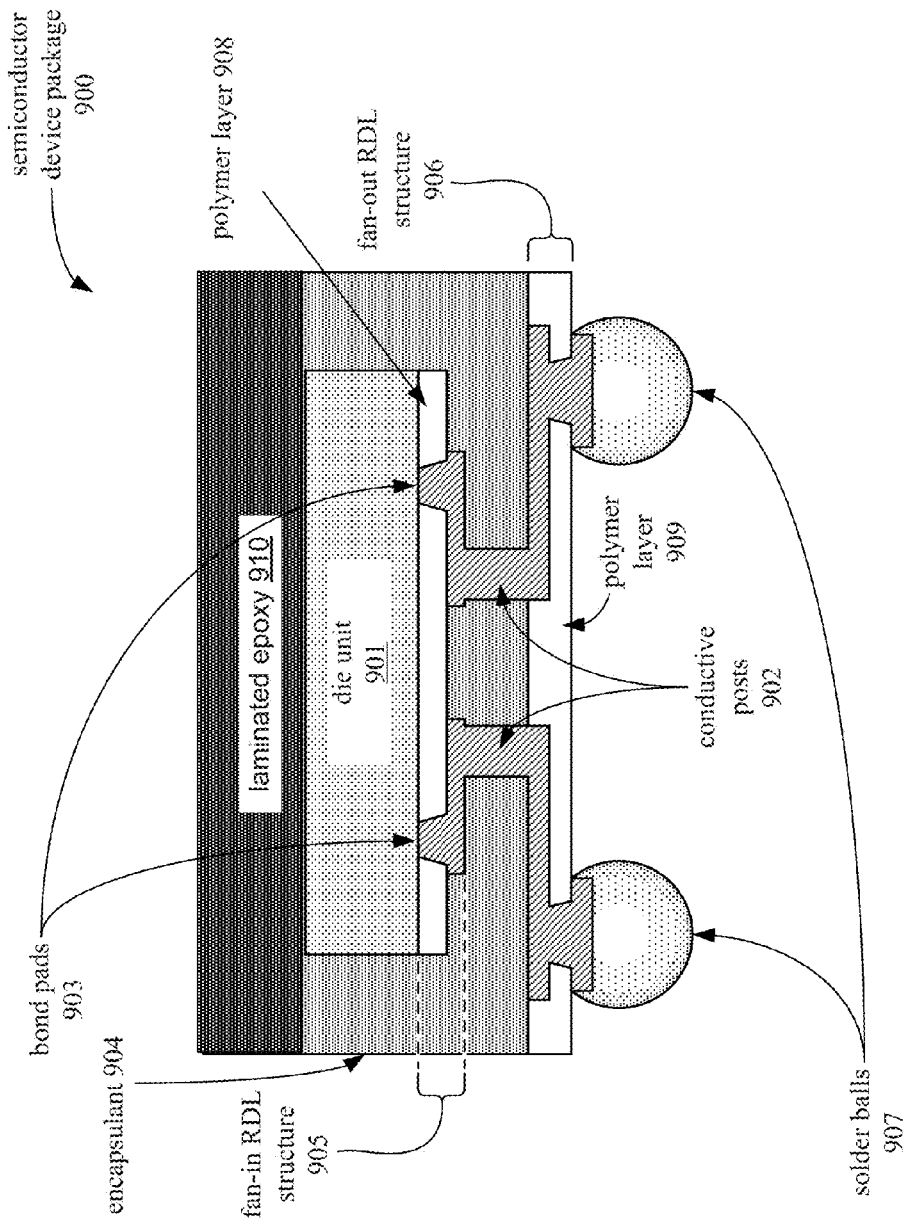
FIG. 9 illustrates an embodiment of a ball grid array (BGA) semiconductor device package.

FIG. 9 illustrates an individual semiconductor device package 900, according to a particular embodiment. In one particular embodiment, package 900 may be manufactured according to packaging process 200, as illustrated in FIG. 2.

In one particular embodiment, the package 900 includes a semiconductor die unit 901 and a number of conductive interconnects, in this embodiment formed as conductive posts 902, electrically coupled to bond pads 903 of the semiconductor die unit 901. In one embodiment, the conductive posts 902 may be electrically connected to the bond pads 903 directly or through a fan-in RDL structure 905 or any other appropriate RDL structure, which may include a polymer layer 908 to support the traces of RDL structure 905.

The exterior of the package is formed from encapsulant 904 that substantially surrounds the active and four sides of the semiconductor die unit 901. In one embodiment, the conductive posts 902 are electrically coupled with conductive material exposed outside the encapsulant 904. As illustrated in FIG. 9, the conductive material exposed at outside of the encapsulant 904 may be solder balls 907, where the device package 900 is a BGA package. The back side of the die, which is in contact with the adhesive 502, such as temporary mounting tape, during encapsulation, is not encapsulated with encapsulant 601, separately comprises an encapsulant layer, such as laminated epoxy layer 910. The laminated epoxy, or other encapsulant layer, may be applied to the molded wafer after the wafer is removed from the carrier. In that case, the entire back of the package is covered by the encapsulant layer. Alternatively, the encapsulant layer may be applied to the native wafer after thinning the native wafer and before dicing the native wafer. In this case, the encapsulant layer makes contact with the adhesive on the carrier during molding. The resulting structure has the back of the die covered by the laminated epoxy and the encapsulant is exposed on the back of the package outside the die area. Thus, the back surface of the package may be made substantially flat with the laminated epoxy and the encapsulant being made coplanar. The encapsulant would cover the edges of the laminate epoxy as well, resulting in a structure that looks a little different from FIG. 9.

In one embodiment, the conductive posts 902 may be electrically connected to the solder balls 907 through a fan-out RDL structure 906. In one embodiment, the fan-out RDL structure 906 may include a polymer layer 909 to support the conductive traces of the fan-out RDL structure 906 to which the conductive posts 902 and the solder balls 907 are connected.

Figure 10:
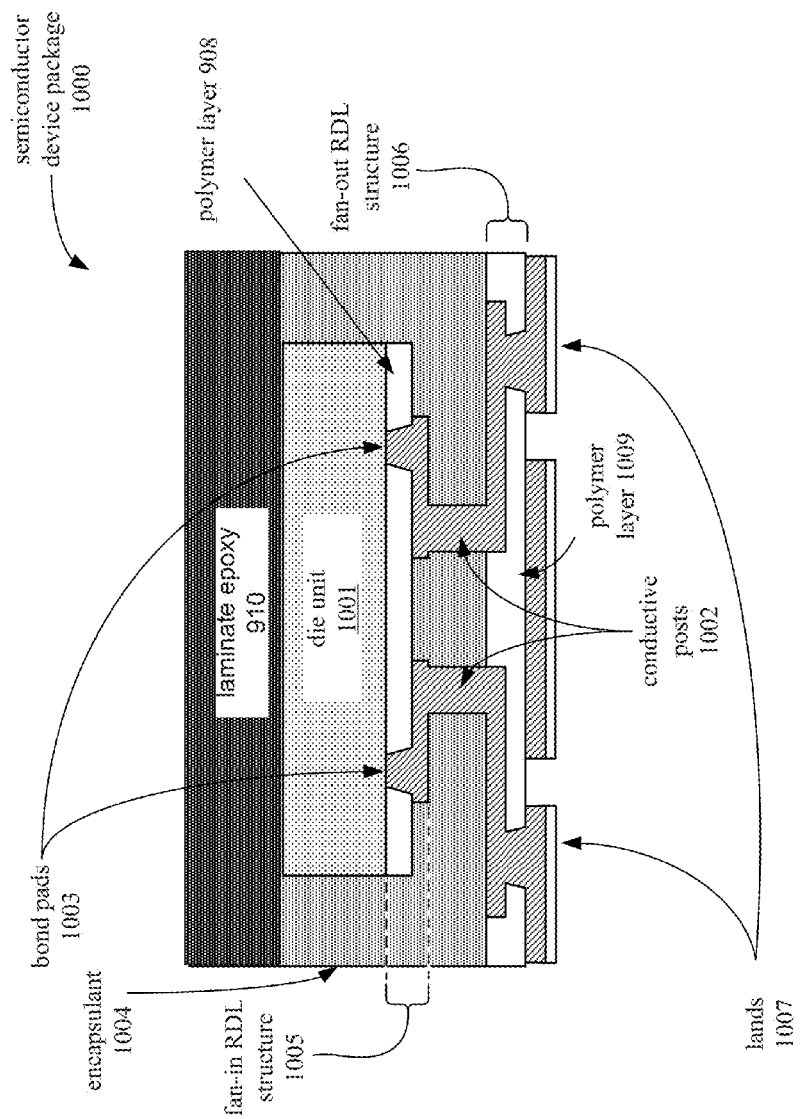
FIG. 10 illustrates an embodiment of a quad flat no-lead (QFN) semiconductor device package.

FIG. 10 illustrates an encapsulated quad flat no-lead (QFN) package 1000 having a land grid array, according to an embodiment. In one embodiment, the package 1000 includes a semiconductor die unit 1001 and a number of conductive interconnects, in this embodiment formed as conductive posts 1002, electrically coupled to bond pads 1003 of the semiconductor die unit 1001. In one embodiment, the conductive posts 1002 may be electrically connected to the bond pads 1003 through a fan-in RDL structure 1005, which may include a polymer layer 1008 to support the traces of RDL structure 1005.

The exterior of the package is formed from encapsulant 1004 that substantially surrounds the front (active) and four sides of the semiconductor die unit 1001 leaving the back side unencapsulated, to which an encapsulant layer, in this embodiment a laminated epoxy layer 910, may be applied as in other embodiments. In one particular embodiment, the conductive posts 1002 are electrically coupled with conductive material exposed at or outside a surface of the encapsulant 1004. As illustrated in FIG. 10, the conductive material exposed outside the surface of the encapsulant 1004 may be lands 1007 of the QFN device package 1000.

In one embodiment, the conductive posts 1002 may be electrically connected to the lands 1007 directly or through a fan-out RDL structure 1006. In one embodiment, the fan-out RDL structure 1006 may include a polymer layer 1009 to support the conductive traces of the fan-out RDL structure 1006 to which the conductive posts 1002 and the lands 1007 are connected.

Embodiments of the present disclosure, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method of making a semiconductor package, comprising:
    placing a plurality of die units face up on a carrier, each die unit having an active front surface comprising at least one bond pad oriented away from the carrier and a back surface opposing the active front surface, the active front surface and the back surface joined by at least four side surfaces;
    forming a plurality of conductive interconnects, each conductive interconnect coupled to the at least one bond pad of one of the plurality of die units;
    encapsulating the plurality of die units and the plurality of conductive interconnects with an encapsulant that covers the active front surface and the at least four side surfaces of each of the plurality of die units;
    exposing a first surface of each of the plurality of conductive interconnects by removal of a portion of the encapsulant; and
    forming a redistribution layer (RDL) disposed over, and in direct contact with, the encapsulant.

2. The method of making the semiconductor package of claim 1, further comprising encapsulating the plurality of die units and the plurality of conductive interconnects in a single step.

3. The method of making the semiconductor package of claim 1, further comprising exposing the first surface of each of the plurality of conductive interconnects, wherein exposing the first surface of each of the plurality of interconnects comprises leaving at least a portion of the encapsulant disposed over the active front surface of each of the plurality of die units.

4. The method of making the semiconductor package of claim 1, further comprising forming the encapsulant as a polymer layer or dielectric film positioned between the plurality of die units and the carrier, the polymer layer or dielectric film being permanently attached to the plurality of die units.

5. The method of making the semiconductor package of claim 1, further comprising disposing a dielectric film over the back surface of the plurality of die units comprising a thickness between a ratio of 5:1 and 1:5 compared with a thickness of the encapsulant covering the active front surface.

6. The method of making the semiconductor package of claim 1, further comprising encapsulating the plurality of die units with a compression molding process or lamination process.

7. The method of making the semiconductor package of claim 1, further comprising forming the plurality of conductive interconnects as plated posts.

8. The method of making the semiconductor package of claim 1, further comprising coupling the plurality of conductive interconnects to fan-in redistribution layers disposed between each of the plurality of die units and the conductive interconnects.

9. A method of making a semiconductor package, comprising:
    providing a first die unit comprising an active front surface comprising a bond pad that is opposite a back surface, the active front surface and the back surface joined by at least four side surfaces;
    forming a fan-in redistribution layer (RDL) over the active front surface and coupled to the bond pad;
    forming a conductive interconnect coupled to the fan-in RDL and the bond pad of the active front surface;
    disposing the first die unit over a carrier with the active front surface oriented away from the carrier; and
    encapsulating the first die unit and the conductive interconnect with an encapsulant that covers the active front surface and the at least four side surfaces of the first die unit.

10. The method of making the semiconductor package of claim 9, further comprising encapsulating the first die unit and the conductive interconnect with the encapsulant in a single step.

11. The method of making the semiconductor package of claim 9, further comprising exposing the conductive interconnect through removing a portion of the encapsulant.

12. The method of making the semiconductor package of claim 9, further comprising encapsulating the first die unit and the conductive interconnect before removing the carrier.

13. The method of making the semiconductor package of claim 9, wherein the conductive interconnect has a height of at least about 20 microns.

14. The method of making the semiconductor package of claim 9, further comprising forming a second redistribution layer in direct contact with the encapsulant and disposed over the first die unit.

15. The method of making the semiconductor package of claim 9, further including forming the conductive interconnect as a copper post plated over the active front surface of the first die unit.

16. The method of making the semiconductor package of claim 9, further comprising a second die unit disposed within the semiconductor package.

17. A semiconductor package comprising:
- a first die unit having an active surface comprising a plurality of bond pads and a back surface opposing the active surface, the active surface and back surface joined by at least four side surfaces;
- a plurality of conductive posts coupled to the plurality of die bond pads;
- a first encapsulant that covers the active surface, the plurality of conductive posts, and the at least four side surfaces of the first die unit; and
- a first redistribution layer coupled to ends of the plurality of conductive posts.

18. The semiconductor package of claim 17, further comprising a second encapsulant disposed over the back surface of the first die unit, wherein the second encapsulant comprises a footprint that is substantially equal to a footprint of the first die unit and further comprises a surface that is coplanar with a surface of the first encapsulant.

19. The semiconductor package of claim 18, wherein the first redistribution layer is a fan-out redistribution layer formed over the first encapsulant.

20. The semiconductor package of claim 19, further comprising a second redistribution layer formed over the active surface of the first die unit, wherein the conductive posts are plated over the second redistribution layer.

21. The semiconductor package of claim 18, wherein the conductive posts are plated over the plurality of die bond pads on the active surface of the first die unit.

22. The semiconductor package of claim 18, further including a polymer layer or dielectric film disposed over the active surface.

23. The semiconductor package of claim 22, wherein the first redistribution layer is a fan-in redistribution layer formed over the polymer layer or dielectric film.

24. The semiconductor package of claim 18, further comprising a second die unit disposed within the semiconductor package.

25. The semiconductor package of claim 24, wherein a thickness of the first encapsulant covering the active surface has a ratio of between approximately $1/5$ and 5 in relation to a thickness of the second encapsulant covering the back surface.

26. The semiconductor package of claim 18, wherein the conductive posts have a height of at least about 20 microns.

27. The semiconductor package of claim 18, wherein the first encapsulant or the second encapsulant comprise an epoxy film.

28. The semiconductor package of claim 23, further comprising a second redistribution layer formed as a fan-out redistribution layer.

* * * * *